(12) United States Patent
Shigematsu

(10) Patent No.: US 11,199,783 B2
(45) Date of Patent: Dec. 14, 2021

(54) OPTICAL COMPONENT HOLDING APPARATUS FOR HOLDING OPTICAL COMPONENT, AND OPTICAL DEVICE

(71) Applicant: CANON KABUSHIKI KAISHA, Tokyo (JP)

(72) Inventor: Masayasu Shigematsu, Nishitokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 308 days.

(21) Appl. No.: 16/442,872

(22) Filed: Jun. 17, 2019

(65) Prior Publication Data

US 2019/0391502 A1    Dec. 26, 2019

(30) Foreign Application Priority Data

Jun. 25, 2018  (JP) .............................. JP2018-119966

(51) Int. Cl.
*G02B 7/02*      (2021.01)
*G03F 7/20*      (2006.01)

(52) U.S. Cl.
CPC ......... *G03F 7/70825* (2013.01); *G02B 7/021* (2013.01); *G02B 7/026* (2013.01)

(58) Field of Classification Search
CPC ...... G03F 7/70825; G02B 7/026; G02B 7/021
USPC ........................................................ 359/819
See application file for complete search history.

(56) References Cited

U.S. PATENT DOCUMENTS 6,122,114 A      9/2000  Sudo et al.
2019/0101718 A1*  4/2019  Masuzawa ............. G02B 7/021

FOREIGN PATENT DOCUMENTS

JP        H10160996 A    6/1998
JP        2016102915 A   6/2016

* cited by examiner

*Primary Examiner* — James C. Jones
(74) *Attorney, Agent, or Firm* — Rossi, Kimms & McDowell LLP

(57) ABSTRACT

An optical component holding apparatus which is capable of easily correcting tilts of optical components by reducing distortion of the optical components themselves even if the optical components are not substantially circular. A first lens and a second lens which are the optical components are housed in a lens holder. An elastic member urges the first lens against a lens holder to determine a position of the first lens in a direction of an optical axis. The lens holder, the first lens, and the elastic member abut against one another at three positions that are substantially the same when the lens holder, the first lens, and the elastic member are viewed in the direction of the optical axis.

11 Claims, 8 Drawing Sheets

OPTICAL COMPONENT HOLDING APPARATUS FOR HOLDING OPTICAL COMPONENT, AND OPTICAL DEVICE

BACKGROUND OF THE INVENTION

Field of the Invention

The present invention relates to an optical device equipped with an optical component such as a lens, and in particular to an optical component holding apparatus for holding the optical component.

Description of the Related Art

A variety of optical component holding apparatuses for holding a plastic lens (hereafter referred to merely as a "lens"), which is one of optical components, are generally known. For example, an optical component holding apparatus which prevents tilt of a lens caused by burr left on mating surfaces of a die during molding of the lens is known (see, for example, Japanese Laid-Open Patent Publication (Kokai) No. 2016-102915). In this optical component holding apparatus, lens thrust receiving surfaces are formed at regular intervals on the lens. An outer peripheral surface of a convex portion, on which mirror frame thrust receiving surfaces abutting against the lens thrust receiving surfaces are formed, is provided on an inner peripheral side of burr in a radial direction.

The optical component holding apparatus described in Japanese Laid-Open Patent Publication (Kokai) No. 2016-102915 is able to prevent tilt of a lens (that is, distortion with respect to an optical axis) as long as the lens is circular like a taking lens. For an optical device such as an optical viewfinder, a noncircular lens is used for the sake of miniaturization, and it is thus difficult to form lens thrust receiving surfaces at regular intervals on the lens. If a circular lens is used so as to form lens thrust receiving surfaces at regular intervals in such an optical device, the lens itself would be upsized, causing the optical device to capsize as well.

SUMMARY OF THE INVENTION

The present invention provides an optical component holding apparatus and an optical device which are capable of easily correcting a tilt of an optical component such as a lens by reducing distortion of the optical component itself even when the optical component is not substantially circular.

Accordingly, the present invention provides an optical component holding apparatus for holding a first optical component, comprising a holding member for housing the first optical component therein, and an urging member configured to urge the first optical component against the holding member to determine a position of the first optical component in a direction of an optical axis, wherein the holding member, the first optical component, and the urging member abut against one another at three positions that are substantially the same when the holding member, the first optical component, and the urging member are viewed in the direction of the optical axis.

According to the present invention, a tilt of an optical component is easily corrected.

Further features of the present invention will become apparent from the following description of exemplary embodiments (with reference to the attached drawings).

DESCRIPTION OF THE EMBODIMENTS

An example of an optical component holding apparatus according to an embodiment of the present invention will now be described with reference to the accompanying drawings.

Figure 1:
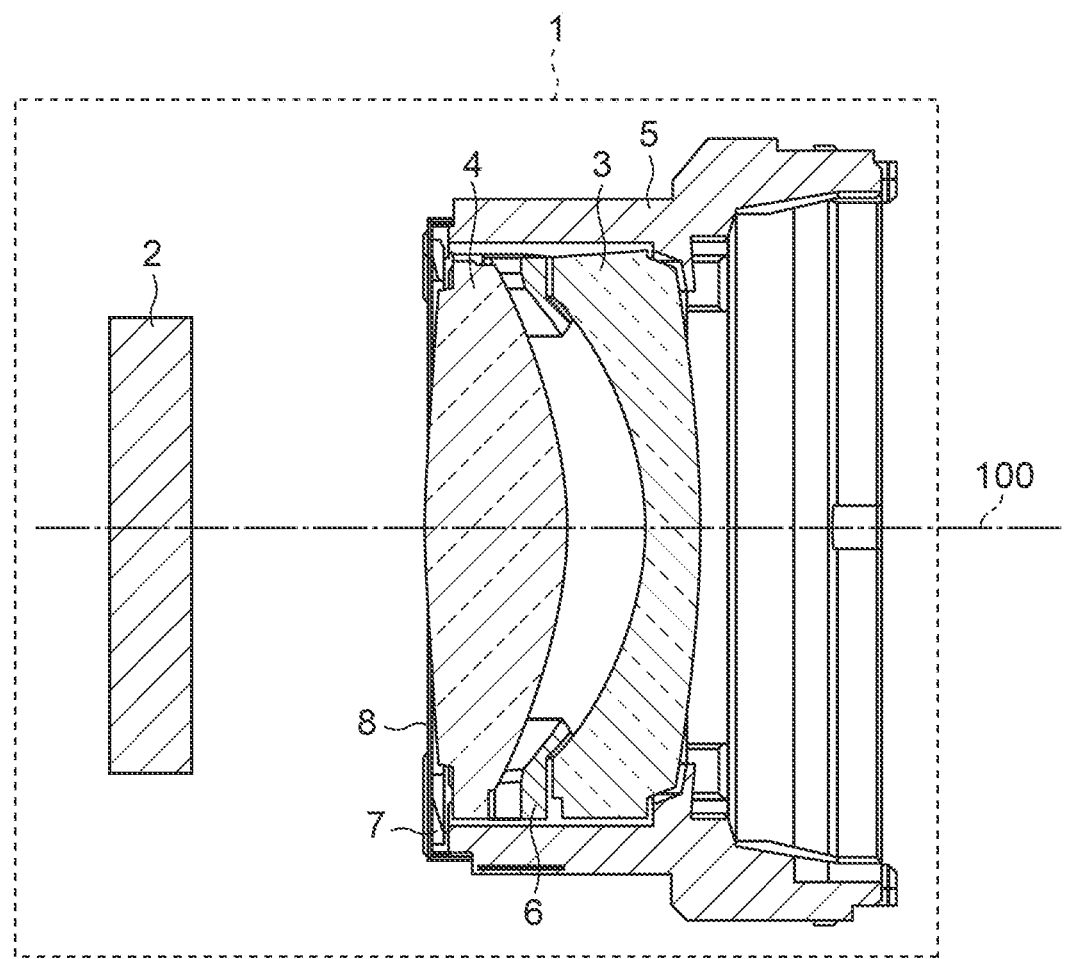
FIG. 1 is a cross-sectional view showing an arrangement of an optical device equipped with an optical component holding apparatus according to an embodiment of the present invention.

FIG. 1 is a cross-sectional view showing an arrangement of an example of an optical device equipped with the optical component holding apparatus according to the embodiment of the present invention. It should be noted that the optical device shown in FIG. 1 is a lens unit.

FIG. 1 shows a cross section taken with an optical axis of the lens unit (optical component) 1 at a center when an image pickup apparatus is held in the regular position. In FIG. 1, a display panel 2 is located on the left side, and an observer (user) is located on the right side.

The lens unit 1 is used for a viewfinder (one of optical devices) in the image pickup apparatus such as a digital camera, a mirrorless camera, or a digital video camera. The lens unit 1 is an optical system which enlarges an image displayed on the display panel 2, and the observer observes an image displayed on the display panel (display unit) 2 through the lens unit 1. It should be noted that the lens unit 1 is mounted integrally with or removably mounted on the image pickup apparatus (hereafter referred to as "the camera").

The lens unit 1 has a first lens (first optical component) 3 and a second lens (second optical component) 4 which are made of plastic, and these lenses 3 and 4 are held by (housed in) a lens holder 5 which is used as a lens holding member.

A spacer 6 is disposed between the lens 3 and the lens 4, and a distance between the lens 3 and the lens 4 is determined by the spacer 6. It should be noted that the spacer 6 is also used as a mask for preventing an excessive amount of light from falling upon the lens 3. An elastic member 7 presses the lenses 3 and 4 and the spacer 6 against the lens holder 5.

A mask (mask member) 8 is used to prevent undesired reflected light produced by an excessive amount of light falling upon the lens 4. Namely, the mask 8 limits light that falls upon the lens 4. The mask 8 is fixed to the lens holder (optical component holding apparatus) 5 by, for example, snap fitting. The mask 8 presses (urges) the lens 3, the spacer 6, and the lens 4 against the lens holder 5 via the elastic member (urging member) 7 in a direction of an optical axis 100.

Figure 2A:
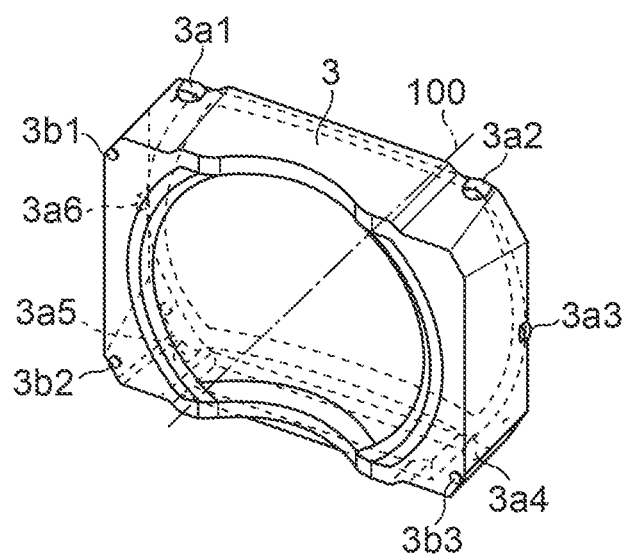
FIGS. 2A and 2B are perspective views showing a shape of a first lens appearing in FIG. 1.
Figure 2B:
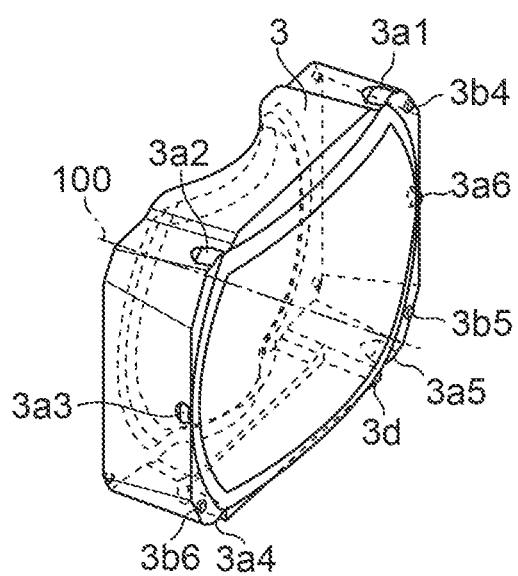

FIGS. 2A and 2B are perspective views showing a shape of the first lens appearing in FIG. 1. FIG. 2A is a perspective view taken from the display panel side, and FIG. 2B is a perspective view taken from the observer side.

Radial receiving surfaces 3a1 to 3a6 for positioning the lens 3 in a radial direction with respect to the optical axis 100 are formed on an outer periphery of the lens 3. The radial receiving surfaces 3a1 to 3a6 abut against radial receiving surfaces 5b1 to 5b6 formed on an inner periphery of the lens holder 5, to be described later. As a result, the lens 3 is positioned in the radial direction such that an optical axis of the lens 3 matches the optical axis 100.

Thrust receiving surfaces 3b1 to 3b6 for positioning the lens 3 in a thrust direction with respect to the optical axis 100 are formed in the lens 3. Specifically, at a peripheral edge outside a mirror portion of the lens 3, the thrust receiving surfaces (abutment surfaces) 3b1 to 3b3 and 3b4 to 3b6 are formed in a protruding manner on a front surface and a rear surface (a first principal surface and a second principal surface), respectively, of the lens 3. It should be noted that the thrust receiving surfaces 3b1 to 3b3 and 3b4 to 3b6 are formed at substantially the same locations when they are projected onto a plane.

The thrust receiving surfaces 3b1 to 3b6 abut against thrust receiving surfaces 5a1 to 5a3 formed in the lens holder 5, to be described later. As a result, a position of the lens 3 in the thrust direction is determined.

Figure 3:
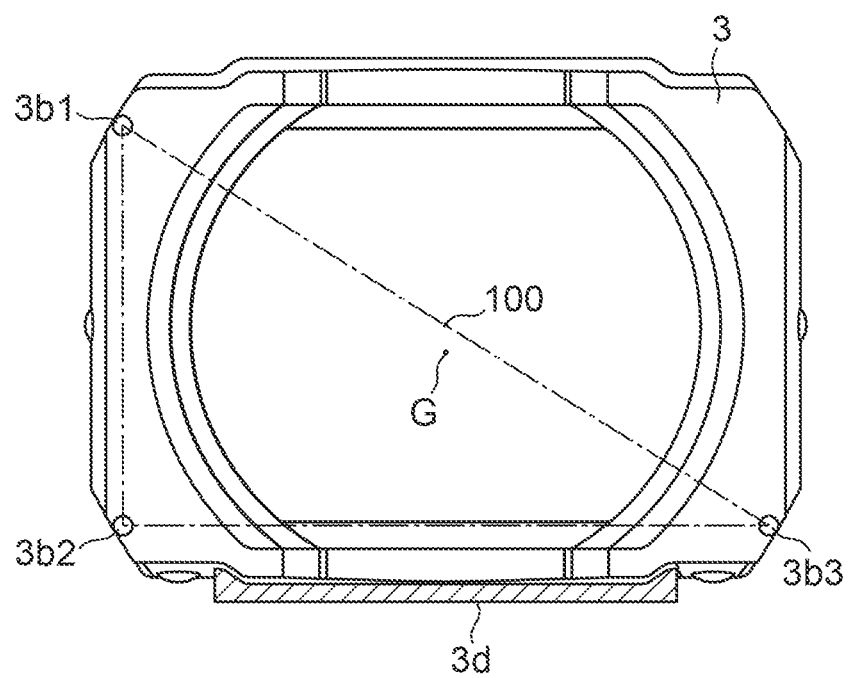
FIG. 3 is a view showing thrust receiving surfaces formed in the first lens appearing in FIG. 1 taken from a display panel side.

FIG. 3 is a view showing the thrust receiving surfaces formed in the first lens appearing in FIG. 1 taken from the display panel side.

The thrust receiving surface 3b1 described above is located on an upper side of the camera when the camera is held in the regular position. The thrust receiving surfaces 3b2 and 3b3 are located on a bottom side of the camera when the camera is held in the regular position. A straight line connecting the thrust receiving surface 3b1 and the thrust receiving surface 3b2 is vertical to the bottom side and the upper side of the camera. A straight line connecting the thrust receiving surface 3b2 and the thrust receiving surface 3b3 is perpendicular to the straight line connecting the thrust receiving surface 3b1 and the thrust receiving surface 3b2.

As a result, when the camera is held in the regular position, the straight lines connecting the thrust receiving surfaces extend along an axis of falling in a tilting direction of the lens 3 and an axis of falling in a horizontal direction of the lens 3. Thus, when the lens 3 tilts due to an error of component dimensions, and heights of the respective thrust receiving surfaces should be corrected, correction values therefor can be easily obtained.

Furthermore, a gate installation part 3d is formed at the peripheral edge of the lens 3 where the thrust receiving surfaces 3b2 and 3b3 are formed. The gate installation part 3d corresponds to an area where a gate is to be provided so as to inject a plastic material into a die when the lens 3 is molded using the die.

When the lens 3 is molded using the die, the gate cannot be provided in an area corresponding to the mirror portion of the lens 3. For this reason, when the gate is provided in an area corresponding to the peripheral edge of the lens 3, the gate installation part 3d is formed on an outer peripheral surface of the peripheral edge of the lens 3.

In general, to prescribe the accuracy of a lens surface of a plastic lens by molding with a die, it is preferred that the lens has an outer shape that is vertically and horizontally symmetrical. Moreover, to keep a posture of the lens 3 with three thrust receiving surfaces when the lens 3 is incorporated into (housed in) the lens holder 5, it is preferred that the center of gravity G of the lens 3 lies inside a projected triangle connecting the three thrust receiving surfaces (inside a triangle).

If the center of gravity G of the lens 3 lies outside the projected triangle connecting the three thrust receiving surfaces, the lens 3 cannot be held by the three thrust receiving surfaces. Namely, the lens 3 is held by two of the three thrust receiving surfaces and by another area that is not a receiving surface. As a result, the lens surface may come into contact with an area against user's will and be scratched.

In view of the above, the gate installation part 3d is placed at the peripheral edge of the lens on the bottom side of the camera where the two thrust receiving surfaces are located. This makes the center of gravity G get close to the bottom side of the camera (the straight line connecting the thrust receiving surface 3b2 and the thrust receiving surface 3b3), and as a result, as shown in FIG. 3, the center of gravity G of the lens can be positioned inside the triangle connecting the three thrust receiving surfaces while the shape of the lens is kept substantially symmetrical with respect to the optical axis.

Furthermore, when the camera is used while being held in the regular position with the above layout, the center of gravity G of the lens 3 can be positioned below the optical axis. This reduces moment that causes the lens 3 to tilt because of gravity as compared to a case where the center of gravity G of the lens 3 is positioned above the optical axis.

Figure 4A:
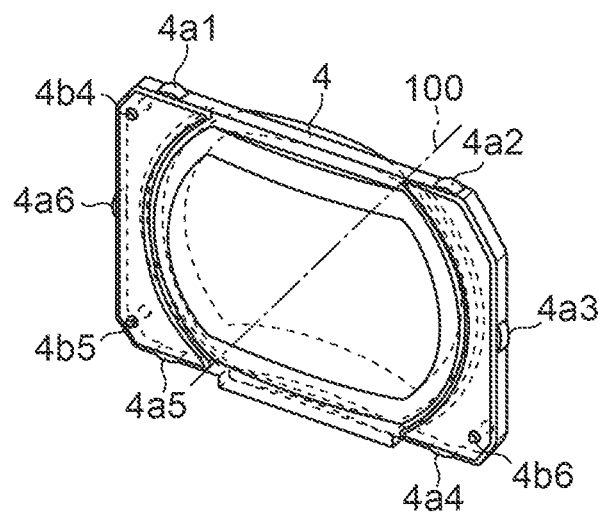
FIGS. 4A and 4B are perspective views showing a shape of a second lens appearing in FIG. 1.
Figure 4B:
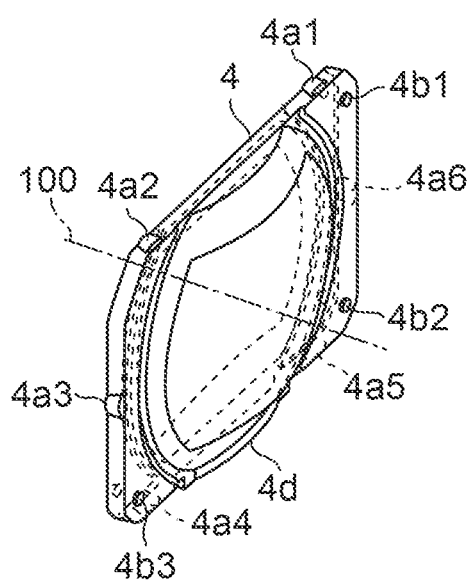

FIGS. 4A and 4B are perspective views showing a shape of the second lens appearing in FIG. 1. FIG. 4A is a perspective view taken from the display panel side, and FIG. 4B is a perspective view taken from the observer side.

As with the lens 3, radial receiving surfaces 4a1 to 4a6 for positioning the lens 4 in a radial direction with respect to the optical axis 100 are formed on an outer periphery of the lens 4. The radial receiving surfaces 4a1 to 4a6 abut against radial receiving surfaces 5c1 to 5c6 formed on the inner periphery of the lens holder 5, to be described later. As a result, the lens 4 is positioned in the radial direction such that an optical axis of the lens 4 matches the optical axis 100.

Thrust receiving surfaces 4b1 to 4b6 for positioning the lens 4 in a thrust direction with respect to the optical axis 100 are formed in the lens 4. Specifically, the thrust receiving surfaces 4b1 to 4b6 are formed at substantially the same locations as the thrust receiving surfaces 3b1 to 3b6 of the lens 3 when they are projected onto a plane along the optical axis 100. As with the lens 3, a gate installation part of the lens 4 is formed on the thrust receiving surfaces 4b2 and 4b3 side so that the center of gravity of the lens 4 can be located inside a triangle connecting the thrust receiving surfaces 4b1 to 4b3 although this is not illustrated in the drawings.

Figure 5A:
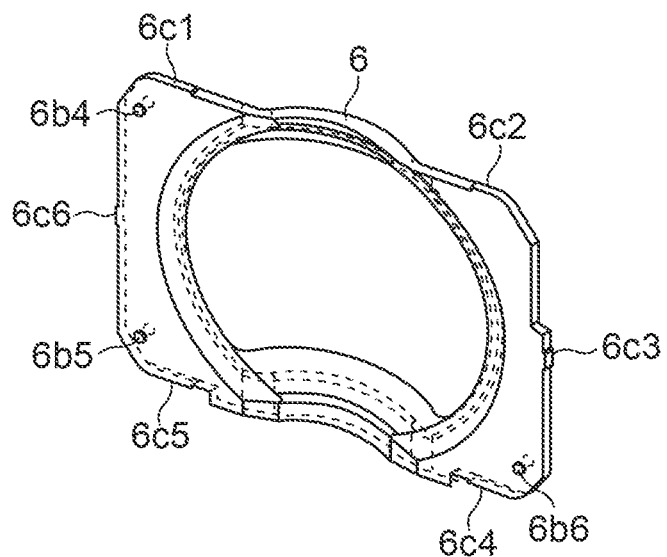
FIGS. 5A and 5B are perspective views showing a shape of a spacer appearing in FIG. 1.
Figure 5B:
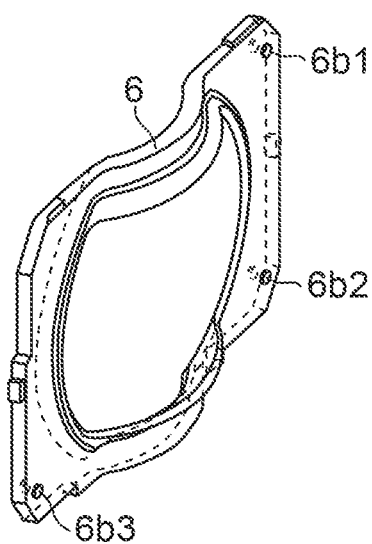

FIGS. 5A and 5B are perspective views showing a shape of the spacer appearing in FIG. 1. FIG. 5A is a perspective view taken from the display panel side, and FIG. 5B is a perspective view taken from the observer side.

In the spacer 6, receiving surfaces 6b1 to 6b3 for a thrust direction are formed on the lens 3 side, and receiving surfaces 6b4 to 6b6 for the thrust direction are formed on the lens 4 side. These receiving surfaces 6b1 to 6b6 are formed at substantially the same locations of the thrust receiving surfaces 3b1 to 3b6 of the lens 3 when they are projected onto a plane along the optical axis 100.

In the spacer 6, receiving surfaces 6c1 to 6c6 for a radial direction are formed. These receiving surfaces 6c1 to 6c6 abut against radial receiving surfaces 5c1 to 5c6 formed on the inner periphery of the lens holder 5, to be described later. As a result, a position of the spacer 6 in the radial direction is determined.

Figure 6A:
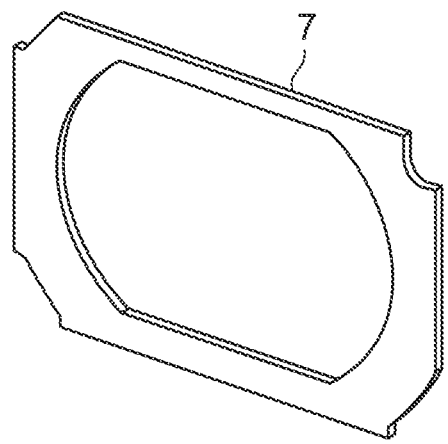
FIGS. 6A and 6B are perspective views showing a shape of an elastic member which abuts against the second lens appearing in FIG. 1.
Figure 6B:
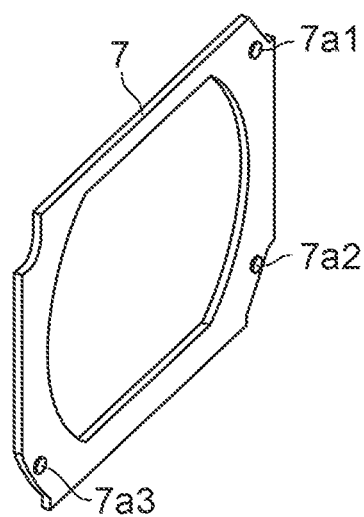

FIGS. 6A and 6B are perspective views showing a shape of an elastic member which abuts against the second lens appearing in FIG. 1. FIG. 6A is a perspective view taken from the display panel side, and FIG. 6B is a perspective view taken from the observer side.

As shown in the drawings, receiving surfaces 7a1 to 7a3 for a thrust direction, which abut against the receiving surfaces 4b4 to 4b6 of the lens 4 for the thrust direction, are formed in the elastic member 7. In the illustrated example, the elastic member 7 is made of silicon rubber.

Figure 7:
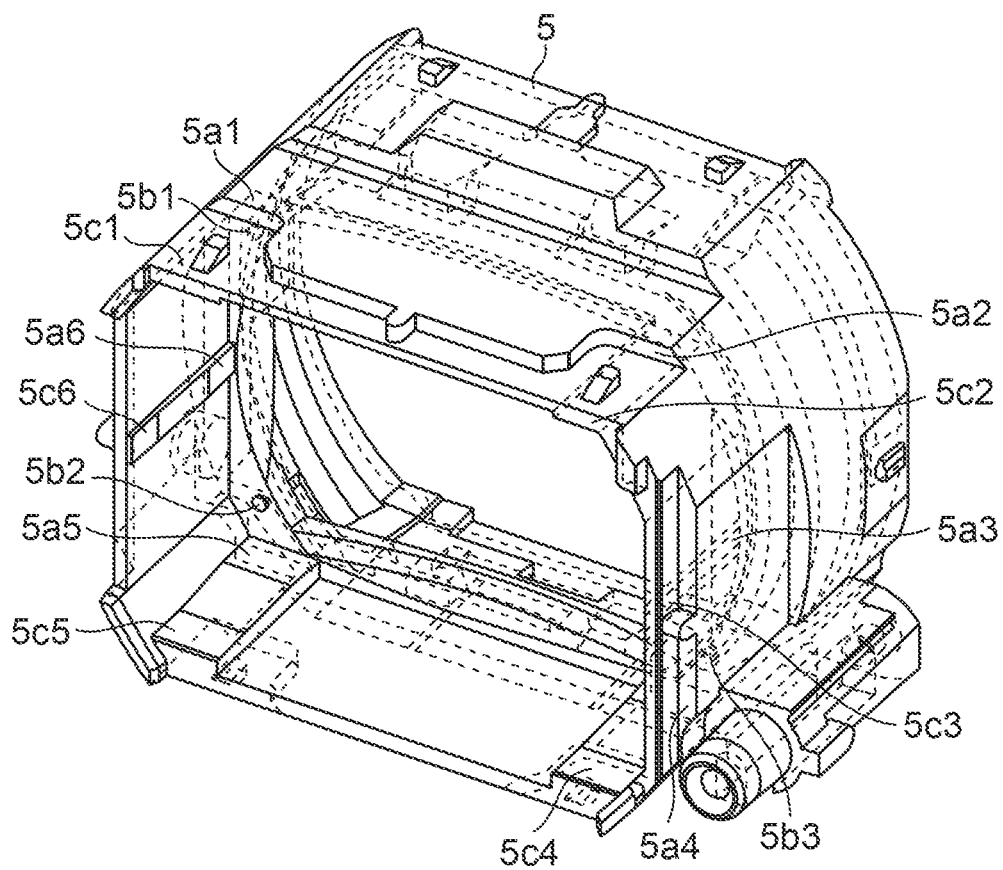
FIG. 7 is a perspective view showing a shape of a lens holder appearing in FIG. 1.

FIG. 7 is a perspective view showing the lens holder appearing in FIG. 1.

The radial receiving surfaces 5a1 to 5a6, the radial receiving surfaces 5c1 to 5c6, and the thrust receiving surfaces 5b1 to 5b3 are formed on the inner peripheral surface of the lens holder 5. The radial receiving surfaces 3a1 to 3a6 of the lens 3 abut against the radial receiving surfaces 5a1 to 5a6 of the lens holder 5. As a result, the lens 3 is positioned in the radial direction such that the optical axis of the lens 3 matches the optical axis 100.

Then, the radial receiving surfaces 6c1 to 6c6 of the spacer 6 abut against the radial receiving surfaces 5c1 to 5c6 of the lens holder 5 to determine a radial position of the spacer 6 with respect to the lens holder 5. The thrust receiving surfaces 6b1 to 6b3 of the spacer 6 then abut against the thrust receiving surfaces 3b1 to 3b3 of the lens 3 to determine a thrust position of the spacer 6 with respect to the lens holder 5.

Further, the radial receiving surfaces 4a1 to 4a6 of the lens 4 abut against the radial receiving surfaces 5c1 to 5c6 of the lens holder 5 to determine a radial position of the lens 4. The thrust receiving surfaces 4b1 to 4b3 of the lens 4 then abut against the thrust receiving surfaces 6b4 to 6b6 of the spacer 6 to determine a thrust position of the lens 4.

Then, the receiving surfaces 7a1 to 7a3 of the elastic member 7 for the thrust direction come into contact with the thrust receiving surfaces 4b4 to 4b6 of the lens 4, and the mask 8 presses the lens 3, the spacer 6, and the lens 4 against the lens holder 5 in the direction of the optical axis and fixes them.

Figure 8:
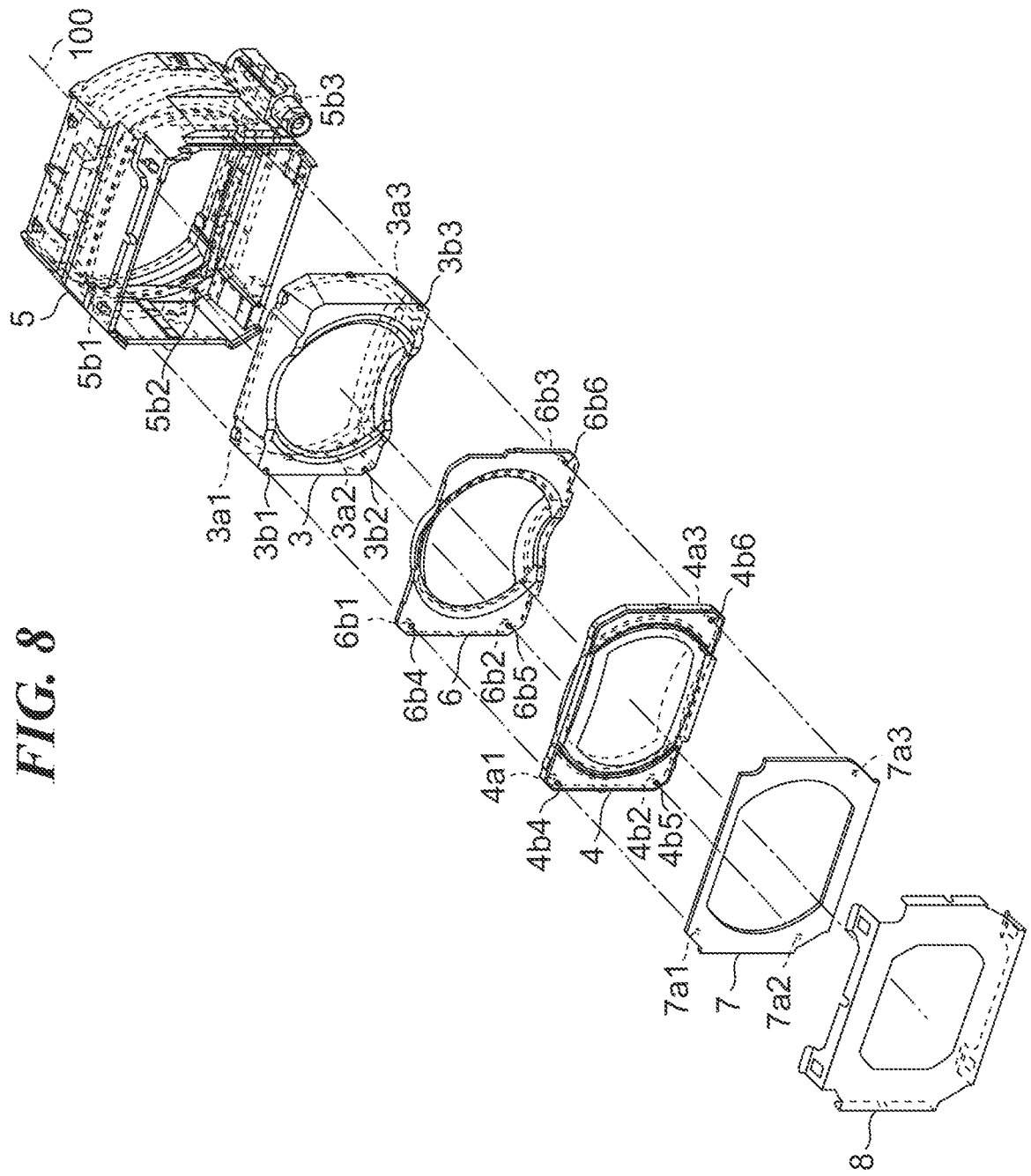
FIG. 8 is an exploded perspective view showing a lens unit appearing in FIG. 1.

FIG. 8 is an exploded perspective view showing the lens unit appearing in FIG. 1.

As shown in FIG. 8, the thrust receiving surface 5b1, the thrust receiving surfaces 3a1 and 3b1, the thrust receiving surfaces 6b1 and 6b4, the thrust receiving surfaces 4b1 and 4b4, and the thrust receiving surface 7a1 are all superimposed on one another when they are projected along the optical axis 100. Also, the thrust receiving surface 5b2, the thrust receiving surfaces 3a2 and 3b2, the thrust receiving surfaces 6b2 and 6b5, the thrust receiving surfaces 4b2 and 4b5, and the thrust receiving surface 7a2 are all superimposed on one another when they are projected along the optical axis 100. Furthermore, the thrust receiving surface 5b3, the thrust receiving surfaces 3a3 and 3b3, the thrust receiving surfaces 6b3 and 6b6, the thrust receiving surfaces 4b3 and 4b6, and the thrust receiving surface 7a3 are all superimposed on one another when they are projected along the optical axis 100.

The lens holder 5, the lens 3, the spacer 6, the lens 4, and the elastic member 7 are thus in contact with one another at the three locations that are substantially the same when they are projected along the optical axis 100.

If the number of the thrust receiving surfaces is four or more, a combination of three thrust receiving surfaces that determine tilts of the lenses 3 and 4 vary with unit-to-unit variations of the lenses 3 and 4 and the spacer 6. As a result, force that distorts the lens surfaces is generated, and lens performance varies with unit-to-unit variations. On the other hand, in the example described above, only three thrust receiving surfaces are provided on one side of each of the lenses 3 and 4 and the spacer 6. Thus, when the lenses 3 and 4 and the spacer 6 are fixed to the lens holder 5 by the mask 8 via the elastic member 7, force acts on only the three thrust receiving surfaces that determine lens tilts. As a result, force that distorts the lens surface is not likely to be generated.

Furthermore, when heights of the three thrust receiving surfaces are to be corrected, correction values therefor can be easily obtained because the straight lines connecting the thrust receiving surfaces extend along an axis of falling in the tilting direction of the lens and an axis of lens falling in the horizontal direction of the lens when the camera is held in the regular position.

As described above, according to the embodiment of the present invention, a tilt of a lens is easily corrected by reducing distortion of the lens itself even when the lens is not substantially circular.

It should be noted that in the example described above, the lens unit is comprised of the two lenses, and the spacer is disposed between these two lenses. On the other hand, even if there is no spacer between a plurality of lenses, and the lenses are in direct contact with each another, for example, the thrust receiving surfaces 3b1 to 3b3 of the lens 3 and the thrust receiving surfaces 4b1 to 4b3 of the lens 4 should abut against each other. Moreover, if there are three or more lenses comprised, the thrust receiving surfaces 3b1 to 3b6 of the lens 3 and thrust receiving surfaces of another lens, which are located at substantially the same positions when they are projected along the optical axis, should abut against each other.

Furthermore, in a case where the lenses are incorporated into the lens holder from two directions i.e. from the display panel 2 side and the observer side, thrust receiving surfaces should be disposed in each of the lens holder, lenses, spacer, and elastic member at substantially the same positions when they are projected onto the optical axis.

Although in the example described above, the thrust receiving surfaces are disposed in each of the lens holder, lenses, spacer, and elastic member at substantially the same positions when they are projected onto the optical axis, the locations of the thrust receiving surfaces should not so exactly match one another, but the locations of the thrust receiving surfaces may vary to such an extent that the lenses are not distorted. Moreover, the present invention may also be applied to a case where an optical component such as a lens is held in an optical system other than a viewfinder.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-119966, filed Jun. 25, 2018, which is hereby incorporated by reference herein in its entirety.

What is claimed is:

1. An optical component holding apparatus for holding a first optical component, comprising:

a holding member for housing the first optical component therein; and an urging member configured to urge the first optical component against the holding member to determine a position of the first optical component in a direction of an optical axis, wherein the holding member, the first optical component, and the urging member abut against one another at three positions that are substantially the same when the holding member, the first optical component, and the urging member are viewed in the direction of the optical axis, wherein the holding member, the first optical component, and the urging member have respective abutment portions abutting against one another, and wherein the abutment portions of the holding member, the first optical component, and the urging member protrude from surfaces that define outer shapes of the holding member, the first optical component, and the urging member.

2. An optical component holding apparatus for holding a first optical component, comprising:

a holding member for housing the first optical component therein; and an urging member configured to urge the first optical component against the holding member to determine a position of the first optical component in a direction of an optical axis, wherein the holding member, the first optical component, and the urging member abut against one another at three positions that are substantially the same when the holding member, the first optical component, and the urging member are viewed in the direction of the optical axis, wherein the holding member, the first optical component, and the urging member have respective abutment portions abutting against one another, and wherein in the first optical component, three of the abutment portions are formed on each of a first principal surface and a second principal surface that define the first optical component, and a center of gravity of the first optical component is located inside a triangle defined by connecting the abutment portions formed on the first principal surface and the second principal surface.

3. The optical component holding apparatus according to claim 2, wherein the holding member, the first optical component, and the urging member abut against one another at three positions that are substantially the same with the optical axis at a center when the holding member, the first optical component, and the urging member are viewed in the direction of the optical axis.

4. The optical component holding apparatus according to claim 2, wherein a display unit that displays at least an image is placed on the first optical component side, and a mask member for limiting incidence of light is placed on a surface of the first optical component on the display unit side.

5. The optical component holding apparatus according to claim 2, wherein the first optical component is made of plastic.

6. The optical component holding apparatus according to claim 5, wherein the first optical component is a lens.

7. An optical device that has the optical component holding apparatus according to claim 2.

8. An optical component holding apparatus for holding a first optical component, comprising:

a holding member for housing the first optical component therein; and an urging member configured to urge the first optical component against the holding member to determine a position of the first optical component in a direction of an optical axis, wherein the holding member, the first optical component, and the urging member abut against one another at three positions that are substantially the same when the holding member, the first optical component, and the urging member are viewed in the direction of the optical axis, wherein the holding member, the first optical component, and the urging member have respective abutment portions abutting against one another, and wherein two of the abutment portions are located below the optical axis when an optical device equipped with the first optical component holding apparatus is positioned for use.

9. An optical component holding apparatus for holding a first optical component, comprising:

a holding member for housing the first optical component therein; and an urging member configured to urge the first optical component against the holding member to determine a position of the first optical component in a direction of an optical axis, wherein the holding member, the first optical component, and the urging member abut against one another at three positions that are substantially the same when the holding member, the first optical component, and the urging member are viewed in the direction of the optical axis, wherein the holding member, the first optical component, and the urging member have respective abutment portions abutting against one another, wherein the first optical component is molded using a die, and wherein a gate installation part for use in molding the first optical component is located below the optical axis when an optical device equipped with the first optical component holding apparatus is positioned for use.

10. The optical component holding apparatus according to claim 2, wherein the optical component holding apparatus has a second optical component, which is at least one other optical component, and a spacer that is placed between the first optical component and the second optical component to define a distance between the first optical component and the second optical component in the direction of the optical axis, in addition to the first optical component;

the holding member houses the first optical component, the spacer, and the second optical component therein, the urging member urges the first optical component, the second optical component, and the spacer against the holding member to determine positions of the first optical component and the second optical component in the direction of the optical axis, and the holding member, the first optical component, the second optical component, and the urging member abut against one another at three locations that are substantially the same when the holding member, the first optical component, the second optical component, and the urging member are viewed in the direction of the optical axis.

11. The optical component holding apparatus according to claim 10, wherein the holding member, the first optical component, the second optical component, and the urging member abut against one another at three locations that are substantially the same with the optical axis at a center when the holding member, the first optical component, the second optical component, and the urging member are viewed in the direction of the optical axis.

\* \* \* \* \*